(12) United States Patent
Rissanen (10) Patent No.: US 7,028,042 B2
(45) Date of Patent: Apr. 11, 2006

(54) LOSSLESS DATA COMPRESSION SYSTEM

(76) Inventor: Jorma Rissanen, 140 Teresita way, Los Gatos, CA (US) 95032

( * ) Notice: Subject to any disclaimer, the term of this patent is extended or adjusted under 35 U.S.C. 154(b) by 501 days.

(21) Appl. No.: 10/137,437

(22) Filed: May 3, 2002

(65) Prior Publication Data

US 2003/0212695 A1   Nov. 13, 2003

(51) Int. Cl.
*G06F 17/30* (2006.01)
(52) U.S. Cl. ............................... 707/101; 707/2; 707/3; 707/6; 707/7
(58) Field of Classification Search ................ 707/1–3, 707/6–7, 100–104.1
See application file for complete search history.

(56) References Cited

U.S. PATENT DOCUMENTS

| | | | |
|---|---|---|---|
| 5,627,748 A * | 5/1997 | Baker et al. ................. | 715/531 |
| 6,411,958 B1 * | 6/2002 | Dijkstra ....................... | 707/101 |
| 6,606,037 B1 * | 8/2003 | Ekstrand et al. ............... | 341/50 |
| 2001/0051941 A1 * | 12/2001 | Tonomura ....................... | 707/3 |
| 2001/0056414 A1 * | 12/2001 | Christal et al. ................. | 707/1 |
| 2002/0141422 A1 * | 10/2002 | Hu .............................. | 370/408 |
| 2003/0130981 A1 * | 7/2003 | Nehru et al. .................... | 707/1 |

FOREIGN PATENT DOCUMENTS

WO    WO 02/075929 A1 *  9/2002

OTHER PUBLICATIONS

Streaming Lossless Data Compression Algorithm, ECMA, Jun. 2001, Internet www.emca.ch.*
Manzini, An Analysis of the Burrows-Wheeler Transform, ACM May 2001, p. 669-677.*
Elloumi, M., "Algorithms for the Shortest Exact Common Superstring Problem", Computer Science Department, Faculty of Sciences of Tunis, SACJ/SART, No. 26, 2000, pp. 22-26.
Balkenhol, B. and Kurtz, S., "Universal Data Compression Based on the Burrows-Wheeler Transformation", IEEE Trans. on Computers, vol. 49, No. 10, Oct. 2000, pp. 1043-1053.

(Continued)

*Primary Examiner*—Debbie M. Le
(74) *Attorney, Agent, or Firm*—Venable LLP; Eric J. Franklin (57) ABSTRACT

A method for forming a maximal tree by searching statistical data of symbols from training data. A table is formed including a string having first and second ends, and a symbol of the training data in the first end and a minimal number of preceding symbols in the training data to make a context unique for the symbol. The contexts are sorted in lexical order with priority on the first end. A device for forming a maximal tree by searching statistical data of symbols from training data. The device forms a table including a string having first and second ends, and a symbol of the training data in the first end and a minimal number of preceding symbols in the training data to make the context unique for the symbol. The device sorts the contexts in lexical order with priority on the first end.

5 Claims, 8 Drawing Sheets

OTHER PUBLICATIONS

McCreight, E., "A Space-Economical Suffix Tree Construction Algorithm", J.ACM, vol. 23, No. 2, Apr. 1976, pp 262-272.

Sadakane, K., "A Fast Algorithm for Making Suffix Arrays and for Burrows-Wheeler Transformation", 1998, 10 pages.

Weinberger, M.J., Rissanen, J. & Feder, M., "A Universal Finite Memory Source", IEEE Transactions on Information Theory, vol. 41, No. 3, May 1995, pp 643-652.

Rissanen, J., "Lectures on Statistical Modeling Theory", Tampere University of Technology, 1999, pp. 1-65.

Rissanen, J.: "A Universal Data Compression System", IEEE Transactions on Information Theory, vol. IT-29, No. 5, pp 656-664, 1983.

Nohre, R., "Some Topics in Descriptive Complexity", PhD Thesis, Linköping University, Linköping, Sweden, 1994, pp. 44-45.

* cited by examiner

LOSSLESS DATA COMPRESSION SYSTEM

FIELD OF THE INVENTION

The present invention relates to a method for compressing information, in which compressing data is generated by searching statistical data of different symbols from a training data.

BACKGROUND OF THE INVENTION

Virtually all of the currently used data compression systems, such as those of Ziv-Lempel type, PPM and Block-Sorting, are universal, which means that they learn the statistical properties from the string to be compressed, after which the actual compression is done with some of the existing coding systems such as Huffman code or arithmetic code. The learning process may be adaptive, which means that as each symbol in the string is read, the statistics are updated and then the symbol encoded with use of the statistics gathered from the past already processed portion of the string, which allows the new symbol to be decoded. In the Block-Sorting method of Burrows and Wheeler the learning process is implicit, based on breaking the string into blocks, which are subjected to a special preprocessing algorithm followed by another so-called Move-To-Front algorithm, after which the coding is done, for instance with a run-length code.

Because of the learning process involved in these algorithms, the strings must be long in order to obtain good compression. In addition the coding operations tend to be computation demanding and relatively slow. A major disadvantage of the Block-Sorting algorithm is that the encoding and decoding cannot be done on the fly; rather, an entire block, typically 200 kilobytes, must be processed before the symbols can be encoded.

Prior art data compression systems are designed to be universal and applicable to different compression systems. In them a Markov-type machine was fitted to a large body of training data representative of the files to be compressed, such as English text. This kind of arrangement creates the problem, however, that the number of states in the machine grows as the alphabet size, say 256, raised to the power of the order of the Markov machine fitted to data. The number of parameters grows then 256-fold further, because a probability for each symbol of the alphabet at each state needs to be calculated. This severely restricts the order of the Markov machine and the compression available. This problem was solved by Rissanen, [4], who introduced the concept of a Tree Machine (TM) developed further in [7]. It is also known as a Variable-Order-Markov-Chain.

SUMMARY OF THE INVENTION

The present invention is aimed at compressing short files, such as web addresses, emails, short messages and others, which it does considerably better than any of the usual compression algorithms. However, it can also compress long strings nearly as well as the best of the known algorithms with a speed advantage as a bonus. These aims are achieved by not making the algorithm universal. The present invention is based on the construction of a Tree Machine as a subtree of a maximal tree formed from the training data, which is optimal in either of the two senses: 1) Subject to the constraint that the training data are to be compressed to within a selected excess percentage of the shortest possible code length with which any subtree of the maximal tree can encode the data, no smaller subtree can do better. 2) Subject to the constraint that the subtree takes a desired amount of storage, no smaller subtree machine compresses the data better than the constructed one. The optimal tree machine is then converted to a coding system, which can encode files, short or long, that are representative of the type of data specified by the training sample.

The first step in the construction is an algorithm to build a maximal Tree Machine from the training data. This is done with special prefix trees, analogous to the suffix trees published in the literature, [2] and [6], which give the Tree Machine in a form of sorted list of pairs, the second member a symbol of the training sample, and the first member its context. The pairs are sorted by the contexts in the lexical order with priority on the right; this is illustrated below. The string defined by the second members coincides with the string resulting with Burrows-Wheeler transform of the training data string, [3]. Unlike the block sorting algorithm the transformed string is not used here for coding but to store and to represent the maximal Tree Machine. Importantly, this construction of the maximal Tree Machine requires no preselected bound for the length of the contexts. Also, the storage required will be much smaller than in a conventional way of storing trees, and it permits processing of very large training data.

The next step is to prune the maximal tree to a subtree, called OTM for short, which is optimal among all subtrees either in the sense that it permits encoding of the training data to within a preset excess percentage p of the minimum code length achievable by any subtree, or requiring a desired amount of storage. Each node of the subtree has the counts of the number of times each symbol occured at this context. The pruning algorithm will be described below in this description. The final storage of the OTM is done in a novel way in terms of pointers to the Burrows-Wheeler transform of a short data string generating the OTM as described below, together with the symbol occurrence counts. This in general results in a very efficient implementation of the OTM.

As the final step a Huffman code or an Arithmetic code is constructed from the counts at the nodes of the OTM, with which any string, short or long, can be encoded. Since a new string to be encoded may have symbols that did not occur in the training data, and their counts at the nodes of the OTM are zero, a special way to assign probabilities to all the symbols is needed, which allows for their encoding. Several techniques exist for this; below a novel one will be described.

BRIEF DESCRIPTION OF THE DRAWINGS

Embodiments of the invention will now be described by example with reference to the appended drawings, in which.

DETAILED DESCRIPTION OF THE INVENTION

Maximal Tree Machine

Figure 8:
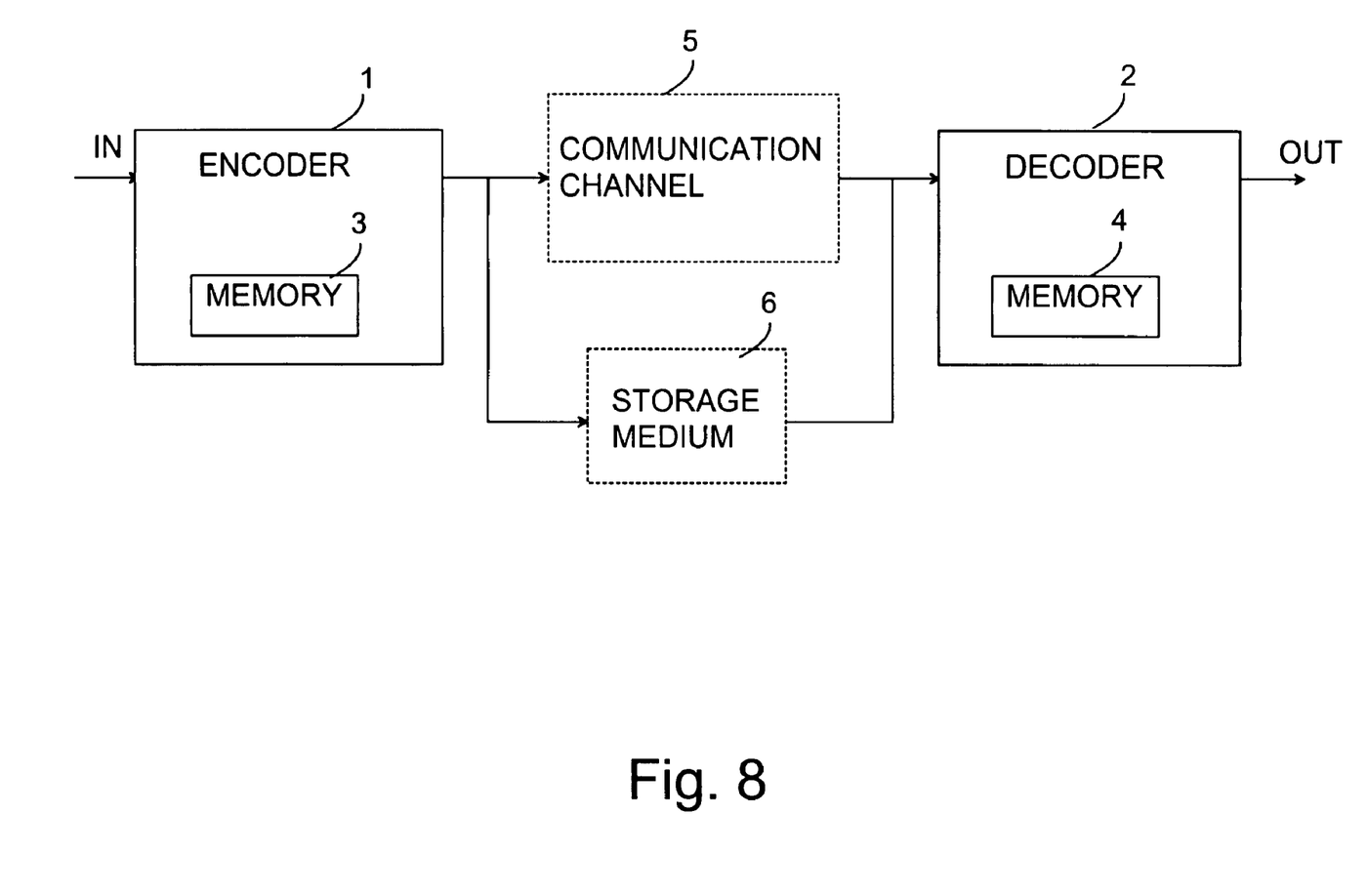
FIG. 8 illustrates an encoding/decoding system according to an advantageous embodiment of the present invention.

In the following the construction of the maximal tree machine out of a training set of data will be described. It will be done in terms of the non-restrictive example training data $x''=\lambda$bbccacbabcaaaab, where the alphabet consists of the symbols {a,b,c}, sorted alphabetically together with a special symbol $\lambda$, [1], appended to the alphabet as the first symbol. The construction of the maximal tree machine can be performed by using a suitable training data and the tree machine can then be stored both to the encoder 1 (FIG. 8) and decoder 2. It is obvious that the training data can be different in different embodiments of the present invention. In the prefered embodiment the alphabet is the set of the first 256 integers, each written in binary as an 8-bit 'byte'. The longest prefix of each symbol in $x''$, such as $\lambda$bbcca of the first occurrence of symbol c, gives the context where this symbol occurs. There are so-called suffix algorithms, [2], which can sort all the n suffixes lexically in time linear in n. The following table illustrates the result of an analogous prefix algorithm, which sorts the prefixes lexically with preference to the right. The middle column shows indices (or lengths) of the prefixes, pointing to the string $x''$. The last column shows the symbols following their prefix. Notice that the symbol following the entire string is taken as $\lambda$.

TABLE 1

Prefix sorted tree (contents are underlined)

| $\lambda$ | 0 | b |
|---|---|---|
| $\lambda$bbccacbabc<u>aaaa</u> | 14 | b |
| $\lambda$bbccacbab<u>caaa</u> | 13 | a |
| $\lambda$bbccacbab<u>caa</u> | 12 | a |
| $\lambda$bbccac<u>ba</u> | 8 | b |
| $\lambda$bbccacbab<u>ca</u> | 11 | a |
| $\lambda$bb<u>cca</u> | 5 | c |
| $\lambda$<u>b</u> | 1 | b |
| $\lambda$bbccacbabcaa<u>ab</u> | 15 | $\lambda$ |
| $\lambda$bbccac<u>bab</u> | 9 | c |
| $\lambda$<u>bb</u> | 2 | c |
| $\lambda$bbcca<u>cb</u> | 7 | a |
| $\lambda$bbcc<u>ac</u> | 6 | b |
| $\lambda$bbccab<u>abc</u> | 10 | a |
| $\lambda$<u>bbc</u> | 3 | c |
| $\lambda$bb<u>cc</u> | 4 | a |

The string defined by the last column, namely $y''$=bbaabacb$\lambda$ccabaca, is the Burrows-Wheeler transform of the original string $x''$. It has the crucial property that it determines $x''$ and the entire table. Because even the prefix sorted trees can be generated in time proportional to the length of the string n, very long strings can be processed.

Figure 1:
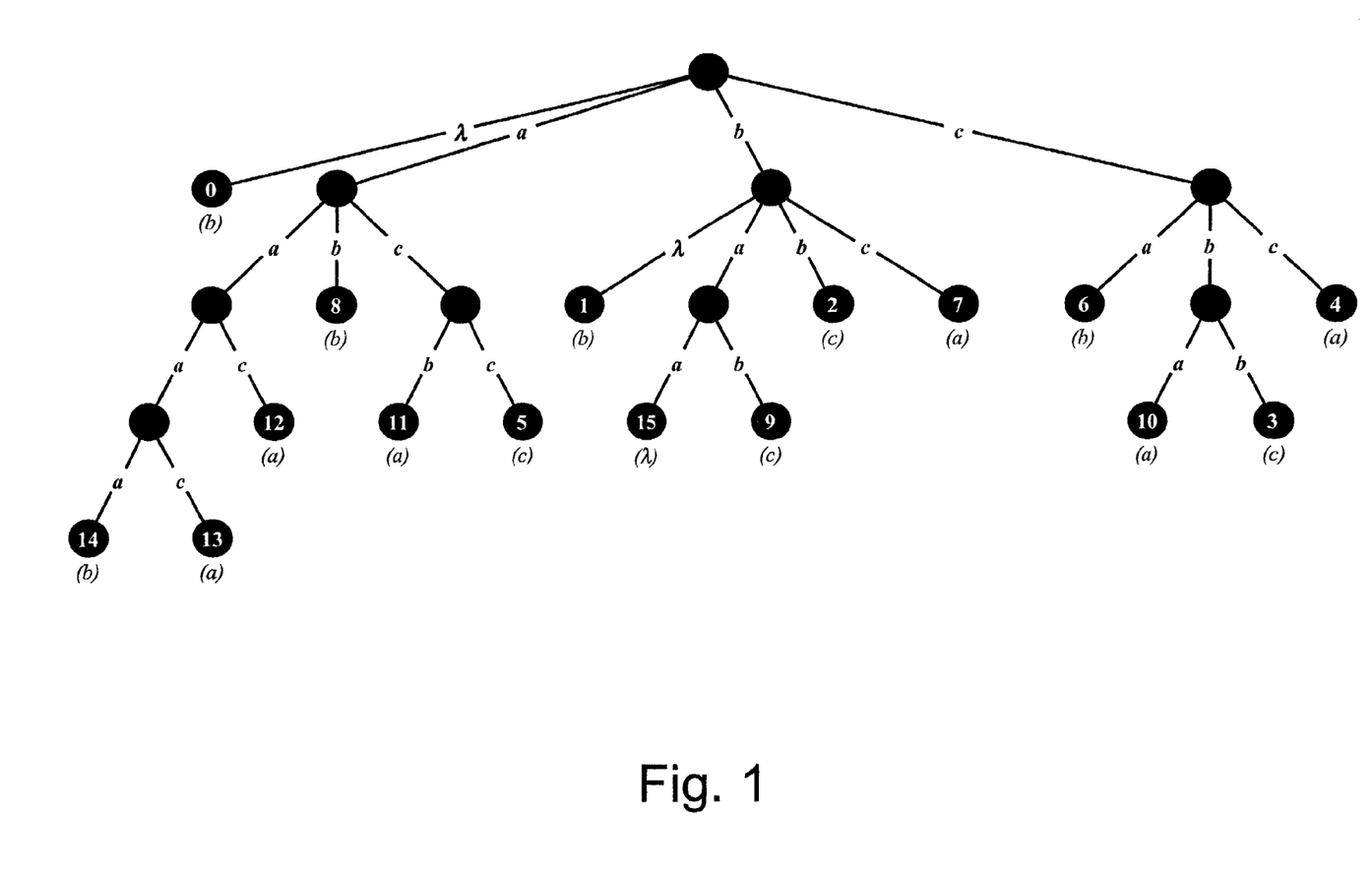
FIG. 1 shows the maximal tree for an example string.

The maximal tree is obtained by retaining just enough of the rightmost symbols of each prefix to make the so-defined minimal prefixes, called from here on contexts, of the symbols in the last column distinct. The contexts define an up-down tree with the root at the top, and each context, when read from right-to-left, defines a path from the root to a leaf node. Hence, in the example, illustrated in FIG. 1, the left-most leaf is the context $\lambda$, the next is the context aaaa and so on. In particular, the branches emanating from the root in left-to-right order are the right-most symbols of the contexts; i.e., the symbols $\lambda$, a, b and c in the alphabet. This is the maximal tree. There is exactly one symbol occurrence at each node of the maximal tree that is defined by a context. For instance, the symbol occuring in context aaaa is b and that occuring in context caaa is a and so on. FIG. 1 shows the maximal tree for an example string, $x''=\lambda$bbccacbabcaaaab. Its representation in terms of the Burrows-Wheeler transformed string $y''$=bbaabacb$\lambda$ccabaca is given in Table 1.

Figure 2:
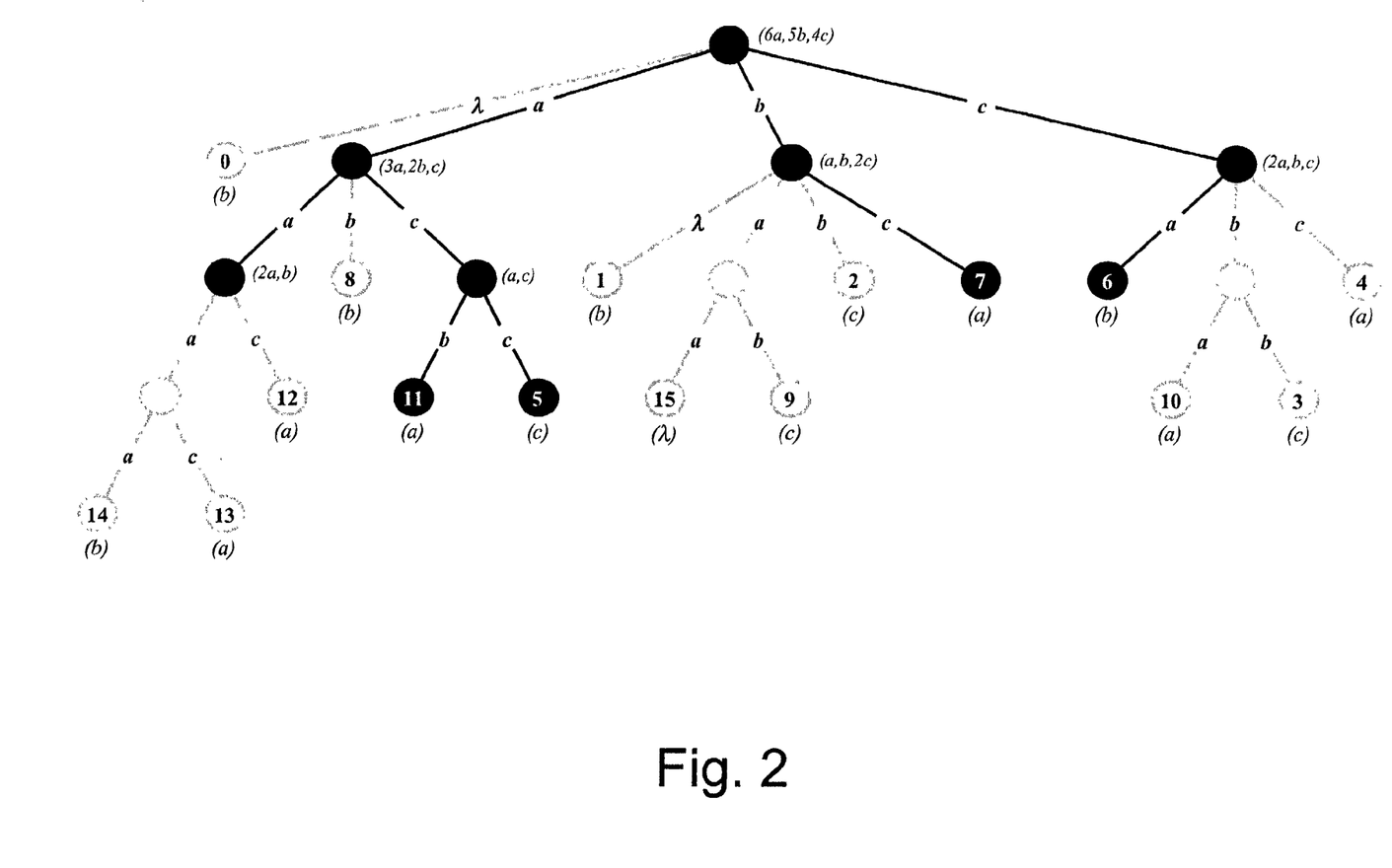
FIG. 2 shows a subtree of the maximal tree.

By collapsing adjacent rows into a common suffix a subtree of the maximal tree will be obtained. For instance, the leaves aaaa and caaa give rise to their father node aaa, in which both of the son-nodes' symbols occur, namely the set {a, b}. Table 2 shows the maximal tree and the subtree defined by the contexts aa, bca, cca, cb and ac which may be identified with the root. The numbers in the last column are enough to describe the structure of the subtree: if the number is positive, there is one node in the subtree for the corresponding range of prefixes; if the number is negative, there is no node for that range. The substrings in the third column falling between the horizontal lines give the occurences of the symbols at the contexts. Note the crucial property that they partition the Burrows-Wheeler transformed string in the second column. The subtree is also shown in FIG. 2: the strings at the leaves together with the last symbol b at the root partition of the transformed string in FIG. 1.

TABLE 2

Maximal tree of string $x^n = \lambda$bbccacbabcaaaab together with a subtree

| $\lambda$ | 0 | b | −1 |
|---|---|---|---|
| aaaa | 14 | b | 3 |
| caaa | 13 | a | |
| caa | 12 | a | |
| ba | 8 | b | −1 |
| bca | 11 | a | 1 |
| cca | 5 | c | 1 |
| $\lambda$b | 1 | b | −1 |
| aab | 15 | $\lambda$ | −2 |
| bab | 9 | c | |
| bb | 2 | c | −1 |
| cb | 7 | a | 1 |
| ac | 6 | b | 1 |
| abc | 10 | a | −2 |
| bbc | 3 | c | |
| cc | 4 | a | −1 |

A node in the tree will be denoted by s, and $n_{i|s}$ for the number of times symbol i occurs at node s. Hence $n_{i|s}=0$ if a symbol i does not occur at node s. Write $$n_s = \sum_i n_{i|s}.$$

Then by the construct, $$\sum_{sj} n_{i|sj} = n_{i|s}$$

where sj runs through the son nodes of s.

Tree Pruning

The maximal tree can be pruned by dropping the son nodes of a collection of father nodes while retaining the counts of the symbol occurrences at the father nodes. The father nodes then become leaves of the pruned tree. Any such subtree T assigns an ideal code length to the training set as follows $$L_T(x^n) = \sum_x \log \frac{n_{s(x)}}{n_{x|s(x)}} \quad (1)$$

where x runs through the symbols in the training sequence $x^n$ and s(x) denotes the deepest node in the tree where symbol x occurs, except for the early symbols $x_1, x_2, \ldots$ whose contexts do not reach the leaves. The word 'ideal' is used because a real code length is an integer-valued number while the negative logarithm of a probability may not be so. However, the ideal can be achieved to a sufficiently good approximation in practice.

There are other more important reasons why the ideal code length is not achievable in real coding. First, the decoder has not yet decoded the symbol x and does not know the steepest node where this symbol occurs. The second problem arises because some symbol counts may be zero. The first problem can be solved if the deepest node s(x) is replaced by the deepest node in the tree that can be found by 'climbing' the tree T thus: Let $x^n = x_1, \ldots x_{t-2}, x_{t-1}, x_t, x, \ldots$, where $x=x_{t+1}$ is the new symbol to be encoded. Climb the tree by reading the prefix $\ldots x_{t-1}, x_t$ from right-to-left. Hence, at the root take the branch marked by symbol $x_t$. Next, take the branch $x_{t-1}$ at this node and continue until a node is reached where the scanned symbol does not occur, or if it is the very first symbol $x_1$ in the string. The branches at the root are marked by all the symbols that occur in the training sample.

Figure 3:
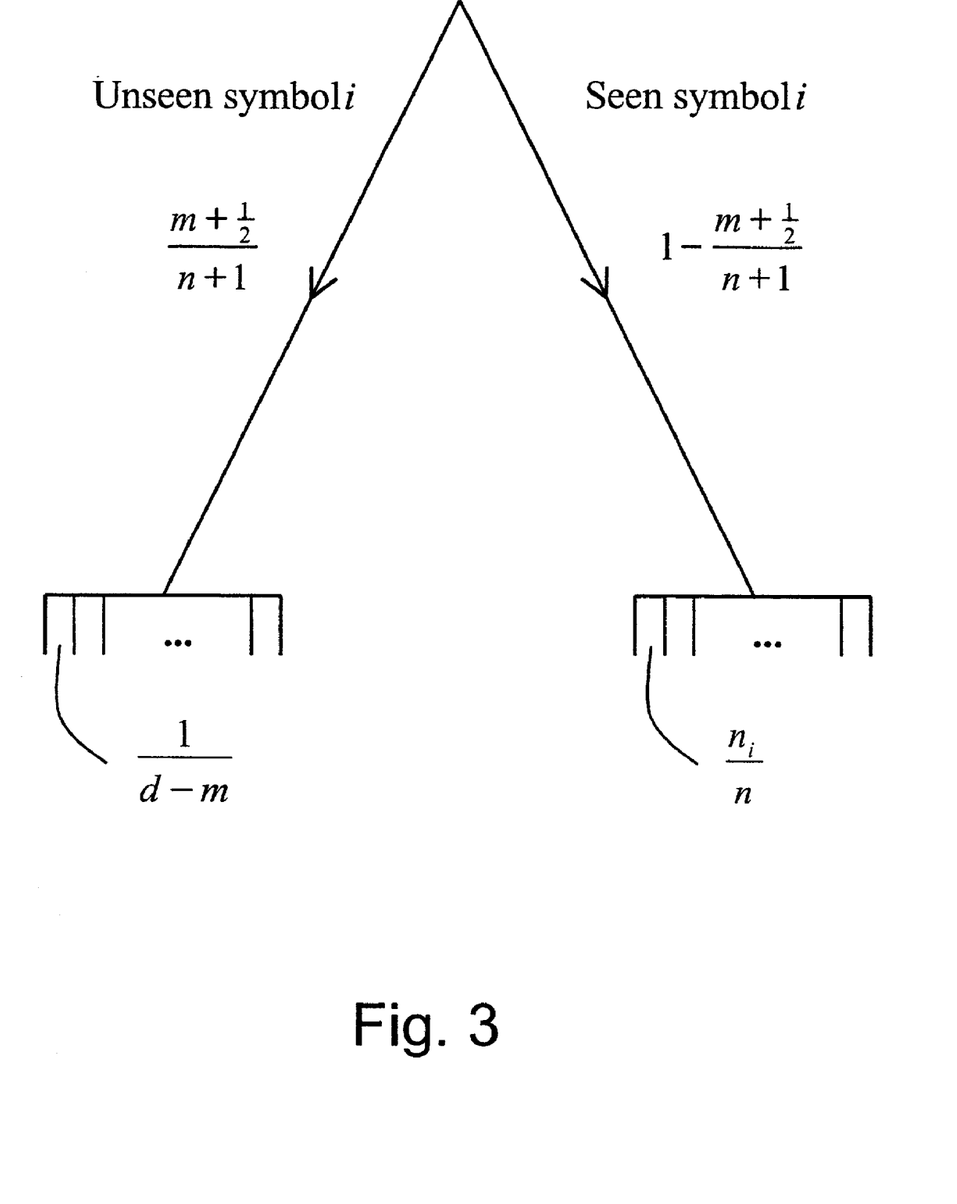
FIG. 3 demonstrates the assignment of probabilities of symbols i, of which m distinct symbols are among the n symbols occuring at a node, or they are absent.

While both the encoder 1 (FIG. 8) and the decoder 2 always find the same context by this climbing process it may well happen that the next symbol to be encoded and decoded does not occur at this context; i.e., its symbol count is zero. Nevertheless we must assign a codeword even for such a symbol, which amounts to assigning a positive probability. This choice is very important in achieving a good compression, because it leaves smaller probabilities and hence longer code lengths for the symbols that do occur. Assume that the number of symbols in the alphabet is d, and let the number of distinct symbols among the $n_s$ occurrences of symbols at node s be m. Since each of these symbols must have been a new symbol at the time it occured first, m binary events "the next symbol is a symbol not among the ns symbols" have been observed in $n_s$ occurrences of this and the opposite binary event. A good way to assign probabilities to such binary events is to put the probability $(m+\frac{1}{2})/(n_s+1)$ to a new symbol; see for instance [5]. This reflects the belief that for small m and large $n_s$ the context s strongly favors repeated occurrences of the few symbols that already have been seen at this context. On the other hand, if m is close to d, then most of the symbols in the alphabet have already been seen in this context, which leaves few new symbols, and the probability of a symbol being new should again be small. In light of these considerations we set the probability of the unseen symbol i; i.e. $n_{i|s}=0$, as follows; see also FIG. 3, in which the assignment of probabilities of symbols i is demonstrated, of which m distinct symbols are among the n symbols occuring at a node (right branch), or they are absent (left branch).

$$\hat{P}_{i|s} = \begin{cases} \frac{m+1/2}{(n_s+1)(d-m)} & \text{if } 0 < m < d/2 \text{ and } n_s > 1 \\ \frac{d-m}{n_s(d-m)} = \frac{1}{n_s} & \text{if } d/2 \leq m < d \\ 0 & \text{if } m = d \\ 1/d & \text{if } n_s = 1 \end{cases} \quad (2)$$

For the already seen symbol i for which $n_{i|s}>0$ put $$\hat{P}_{i|s} = \begin{cases} \left(1 - \frac{m+1/2}{n_s+1}\right) \frac{n_{i|s}}{n_s} & \text{if } 0 < m < d/2 \text{ and } n_s > 1 \\ \frac{n_s-1}{n_s} \frac{n_{i|s}}{n_s} & \text{if } d/2 \leq m < d \\ \frac{n_{i|s}}{n_s} & \text{if } m = d \\ 1/d & \text{if } n_s = 1 \end{cases} \quad (3)$$

These probability calculations will be illustrated for strings of length one and two over the alphabet {a, b, c}, where the occurrence counts at the node s are for $n_s=2$, (2, 0, 0) and (1, 1, 0), with the examples: For $n_s=1$:

$$\hat{P}_{a|s} = \hat{P}_{b|s} = \hat{P}_{c|s} = 1/d = 1/3 \quad (4)$$

For the occurrence counts (2, 0, 0):

$$\hat{P}_{b|s} = \hat{P}_{c|s} = \frac{1+1/2}{3} \times \frac{1}{2} = 1/4 \quad (5)$$

$$\hat{P}_{a|s} = (1-\frac{1}{2}) = \frac{1}{2} \quad (6)$$

For the occurrence counts (1, 1, 0):

$$\hat{P}_{c|s} = \frac{1}{2} \quad (7)$$

$$\hat{P}_{a|s} = \hat{P}_{b|s} = \frac{1}{2} \times \frac{1}{2} = 1/4 \quad (8)$$

The maximal tree will be pruned to a subtree with two distinct strategies in mind. The first objective, which is the preferred one, is to search for a subtree such that its ideal code length does not exceed that of the shortest possible, obtainable with the best subtree of the maximal tree, by more than a given percentage p, taken as a parameter. The second objective is to require the subtree to assign the shortest ideal code length to the training data among all that take no more than a desired amount of storage space, determined by the number of nodes together with the symbol occurrence counts at the nodes. Since not all the nodes of the subtree have the same number of symbol occurrences, the storage space is not determined by the number of nodes alone.

Both goals can be reached optimally by modifying the algorithms [3] and [5], which were designed for finding complete binary MDL (Minimum Description Length) subtrees, [4]. These require calculation of a code length at the nodes which includes the description of the parameters needed to encode the tree itself. In a system according to the present invention the subtree will be communicated to the decoder, and its specification need not be a part of the encoded string unlike in MDL trees. A further problem arises from the fact that in a method according to the present invention the trees are incomplete with some symbols not occuring in all nodes, which change the probabilities even of the seen symbols as discussed above. Finally, subtrees will be seeked with restrictions on either the size of the subtree or its performance.

The first preliminary algorithm finds the overall optimal subtree, denoted by $T_0$ of the maximal tree without any restrictions placed on the subtrees.

Algorithm A: Optimal Subtree
1. Initialize: For every leaf node (a node without any son nodes) compute $$L(s) = -\sum_i n_{i|s} \hat{P}_{i|s} = \log d$$

from Equations (2) and (3). Set $L(s')=0$ for the other nodes $s'$.

2. Consider a father node s and its son nodes sj. The idea is to calculate L(s) for each node as the shortest ideal code length for all the symbols occurrences at the son nodes and their descendants. For s ranging over all father nodes of the leaves calculate for each leaf sj the code length of the occurrences of the symbols at this node, obtained with use of the probabilities at the father node:

$$I(sj) = -\sum_i n_{i|s} \log \hat{P}_{i|s}.$$

The intent is to compare this with the optimal code length L(sj) for exactly the same symbol occurrences at the son node sj. If $$I(sj) \leq L(sj), \quad (9)$$

then the father node's probability assignment is not worse, and we prune the son node sj; else we leave it. Replace L(s) by L(s)+I(sj), if the condition (9) is satisfied, and by L(s)+L(sj), otherwise. This process is repeated for the father nodes of all the so far processed father nodes until the root is reached.

The subtree $T_0$ of the maximal tree resulting from Algorithm A assigns the smallest ideal code length to the training data, because we pruned all the descendants where $I(sj) \leq L(sj)$ and hence which would have encoded the symbols worse than their father nodes. However, this subtree may have more nodes than desired. If we prune the tree further we would have to drop a leaf where $I(sj)>L(sj)$, and the ideal code length will necessarily increase.

The question arises how to prune the maximal tree to the desired OTM so as to lose the least amount of the smallest ideal code length. We describe first a pruning strategy that gives a subtree such that its ideal code length does not exceed that of the $T_0$ by more than a given percentage p, taken as a parameter.

Algorithm B
This is Algorithm A except that the condition (9) is replaced by the following $$I(sj) \leq \max\{(1+p)L(sj), L'(sj)\} \quad (10)$$

where L'(sj) is the code length in node sj in the maximal tree.

The parameter p is easy to select: either we want to select it once and for all regardless of the size of the final OTM, or we simply increase or reduce an initial choice depending on whether the pruned OTM is larger or smaller, respectively, than desired.

Figure 4:
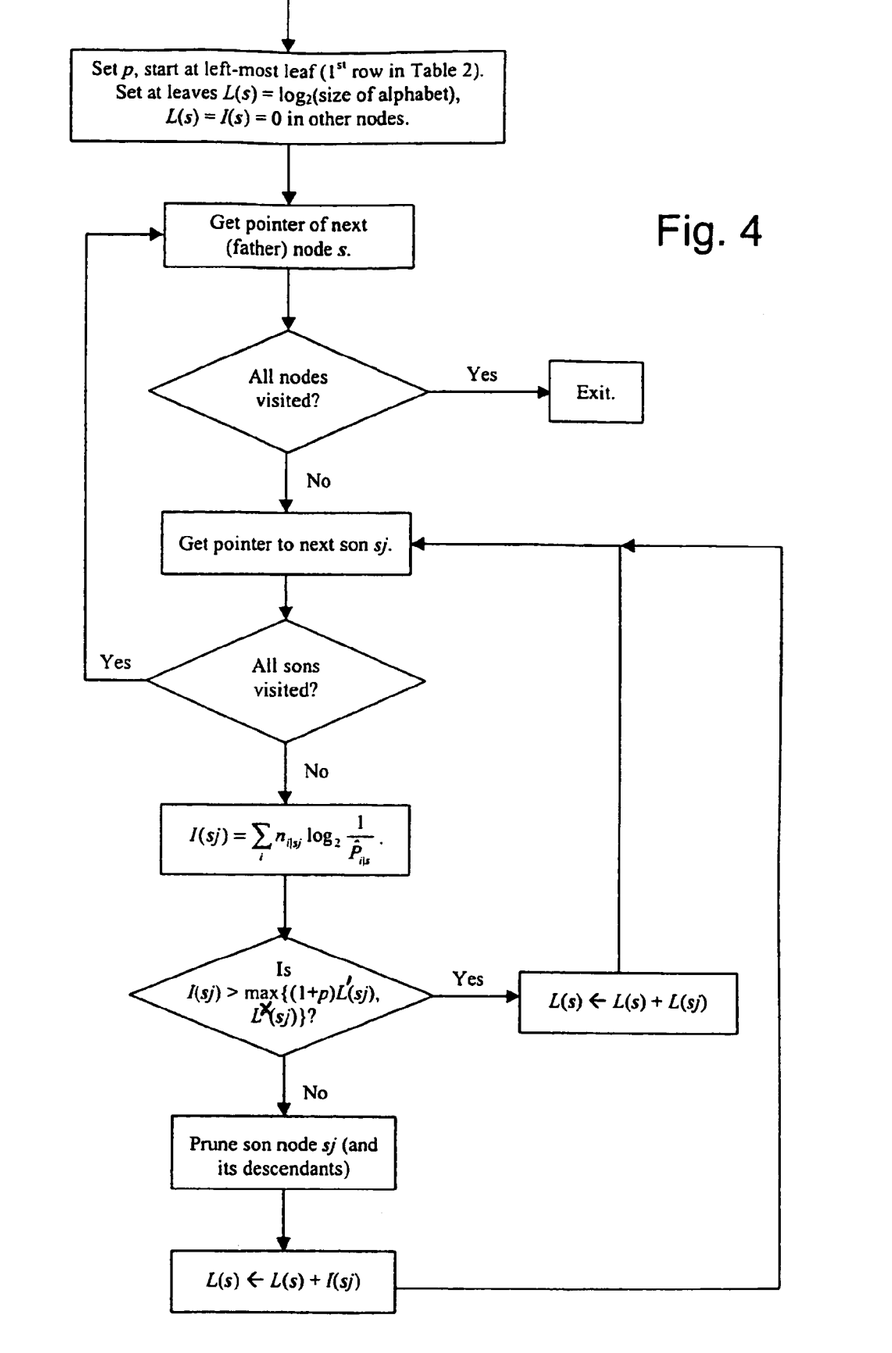
FIG. 4 is a flow chart of Algorithm B for pruning the maximal tree, FIG. 5 demonstrates pruning with Algorithm B.
Figure 5:
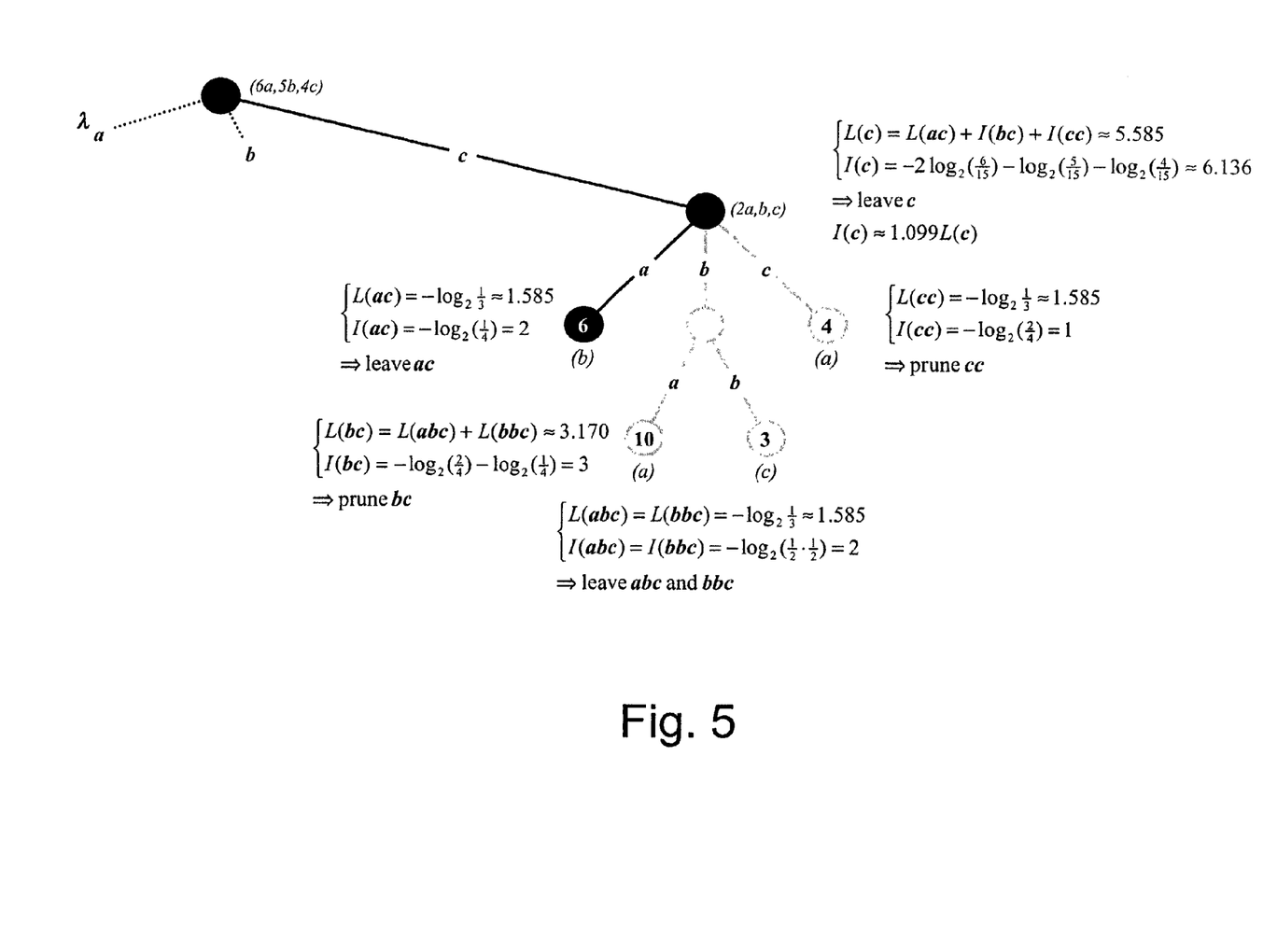

A flow chart of the algorithm is given in FIG. 4, and the pruning process is illustrated in FIG. 5, where the various code lengths are obtained from Equations (2)–(3); see also Equations (4)–(8). In FIG. 5 the son node c will be pruned if parameter $p \geq 0.099$ Algorithm C
This is just like Algorithm B except that the condition (10) is replaced by the following $$I(sj) \leq L(sj) + t \quad (11)$$

where the threshold parameter t is somewhat more difficult to adjust. It can be found by a binary search in the range (0, max $\{I(s)-L(s)\}$): first pick t as half the maximum range, then set t one quarter or three quarters of the maximum range, if the pruned Tree Machine is too small or too large, respectively, and continue until the desired size is reached.

Storage of the Optimal Tree Machine

The final storage space of the optimal tree OTM, which was determined from the training data by constructing the maximal tree and pruning it, can be reduced by a novel storage technique. This is very important, because it determines the coding speed of new data strings as described below, and its storage space represents the overhead that has to be paid both by the encoder and the decoder. The idea is to find a new data string, shorter than the training data string, and its Burrows-Wheeler transform, which in turn determines the structure of the OTM in terms of pointers. It should be recalled that the substrings following the contexts partition the Burrows-Wheeler transform of the training data, so that the contexts can be defined in terms of pointers. Such a string will be called a generating string. Before giving the general algorithm it will be illustrated with the example subtree in Table 2.

The new data string must include all the contexts from the subtree, that is, λ, aa, ba, bca, cca, λb, cb, λc and ac. The contexts λ, λb and λc are needed to store the counts of the pruned children of the non-leaf nodes ϵ (root), b and c, respectively. Clearly, if any permutation of the contexts will be taken and concatenated, a string of twelve symbols that satisfy the condition will be formed. However, the resulting string is not the shortest possible. Considering the contexts cb and bca, the shortest string containing both of the contexts is not cbbca—their concatenation—but cbca. Any time when two contexts where the first one ends with the same substring as the latter begins are concatenated, it is not necessary to write that repeating substring twice. In the case of cb and bca, the substring b will be written only once, saving one symbol. The problem of finding the shortest superstring containing all the given strings is well known and solvable, see [8]. A shortest superstring for the strings λ, aa, ba, bca, cca, λb, cb, λc and ac is λccaacbcaλba. The Burrows-Wheeler transform of the superstring defines the generating string cbcλλaaccbaa, shown in Table 3, which also shows the prefixes of the data string, indices of the prefixes and the occurrence counts in columns one, two and four, respectively.

TABLE 3

A generating string representation of subtree for coding
In the following, an algorithm for finding the characteristic
string of the OTM in the general case will be described.

| prefix; context underline | index | generating string | counts |
|---|---|---|---|
| λ | 0 | c | — |
| λ | 9 | b | 0,1,0 |
| λccaa | 4 | c | 2,1,0 |
| λba | 11 | λ | 0,1,0 |
| λccaacbca | 8 | λ | 1,0,0 |
| λcca | 3 | a | 0,0,1 |
| λb | 10 | a | 0,1,2 |
| λccaacb | 6 | c | 1,0,0 |
| λc | 1 | c | 2,0,1 |
| λccaac | 5 | b | 0,1,0 |
| λccaacbc | 7 | a | 0,0,0 |
| λcc | 2 | a | 0,0,0 |

Algorithm D: Generating String
1. Form the set of contexts S by the following rules. Include the context of every leaf node of the tree. For each node s that has exactly one pruned child js, include the context js. For every node s that has more than one pruned children, include context λs.
2. Generate the shortest exact common superstring $x^k$ for the set of strings S (see [8]).
3. Convert $x^k$ to the generating string $y^k$ by Burrows-Wheeler transform. Exit.

Storing the Optimal Tree Machine

The storage consists of two parts, the first describing the structure of the optimal tree machine, and the second needed to store the counts of the symbols that occur in the leaves of the tree. The structure of any subtree can be conveniently stored by storing the generating string. It can be stored e.g. in the memory means 3 of the encoder and also in the memory means 4 of the decoder.

At each leaf s of the optimal tree there is a sequence of positive integer-valued counts $n_{1|s}, \ldots n_{m_s|s}$, sorted in the increasing order, of the $m_s$ symbols that occur at this node. It will be necessary to store these symbols and their counts. The symbols themselves can be stored with $m_s \log |A|$ bits, where A denotes the alphabet. Hence, if the alphabet is the ASCII symbols then the storage requirement is $m_s$ bytes and the total of $$\sum_s m_s$$

bytes.

Then the increasing count sequence will be stored. Using the same method as in storing the pointers the counts can be stored with $$\log \binom{n_{m_s|s} + m_s}{m_s} \cong (n_{m_s|s} + m_s) h\left(\frac{m_s}{n_{m_s|s} + m_s}\right) \quad (12)$$

bits per leaf, and hence the total of $$\sum_s \log \binom{n_{m_s|s} + m_s}{m_s}$$

bits.

Coding with the Optimal Tree Machine

The OTM is determined from a large body of data, characteristic of the strings we wish to encode. The encoding is done recursively, symbol for symbol, as the string to be encoded is being scanned by the encoder 1. The symbol occurrence counts at the states of the OTM have been converted to a Huffman code or they are used to define the addends of an Arithmetic code. The encoding operations are as follows:

1. Encode the first symbol of the message string $x_1 x_2 \ldots$ with the Huffman/Arithmetic Code at the root of OTM.
2. Recursively, when t first symbols have been encoded, climb the OTM until either a leaf $s^* = x_t, x_{t-1}, \ldots, x_{t-k}$ is met or $s^* = x_t, x_{t-1}, \ldots, x_1$, in which case t is too small for a leaf to be reached. Encode the next symbol $x_{t+1}$ with the Huffman/Arithmetic Code at the node $s^*$. Continue until the entire string has been processed.

The decoding algorithm is performed similarly.

1. Decoding the first symbol $x_1$ from the code string at the root of the same OTM.
2. Recursively, when t first symbols have been decoded, climb the OTM until either a leaf $s^* = x_t, x_{t-1}, \ldots, x_{t-k}$ is met or $s^* = x_t, x_{t-1}, \ldots, x_1$. Decode the next symbol $x_{t+1}$ from the remaining code string at the node $s^*$.

The encoded string can be communicated from the encoder 1 to the decoder 2 by an appropriate communication medium, for example, by a communication network 5 (FIG. 8), or the encoded string can be stored to a storage medium 6, such as a diskette, a CDROM, a DVD, a video tape, etc. The encoded string can then be read from the storage medium 6 by the decoder when the decoding takes place.

Figure 6:
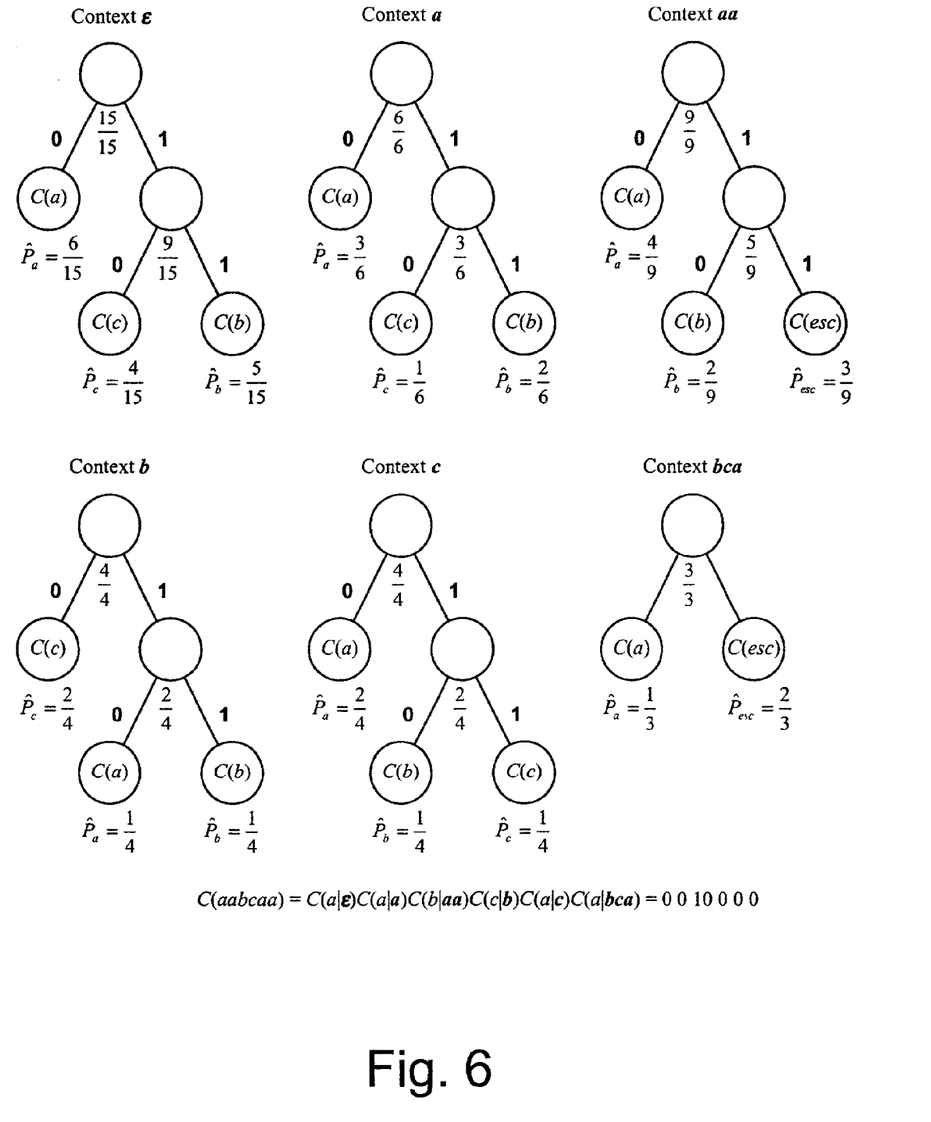
FIG. 6 illustrates Huffman coding of string aabcaa with the Tree Machine defined in Table 2, FIG. 7 gives a comparison of the disclosed DC-algorithm with a number of existing algorithms for text files of length up to 100 kbytes.

In the following the encoding operations will be illustrated with an example in FIG. 6.

For greater coding speed the OTM may be converted to a Finite State Machine by viewing each context defined by a node as a state. Then each symbol effects a state transition, which can be tabulated.

Figure 7:
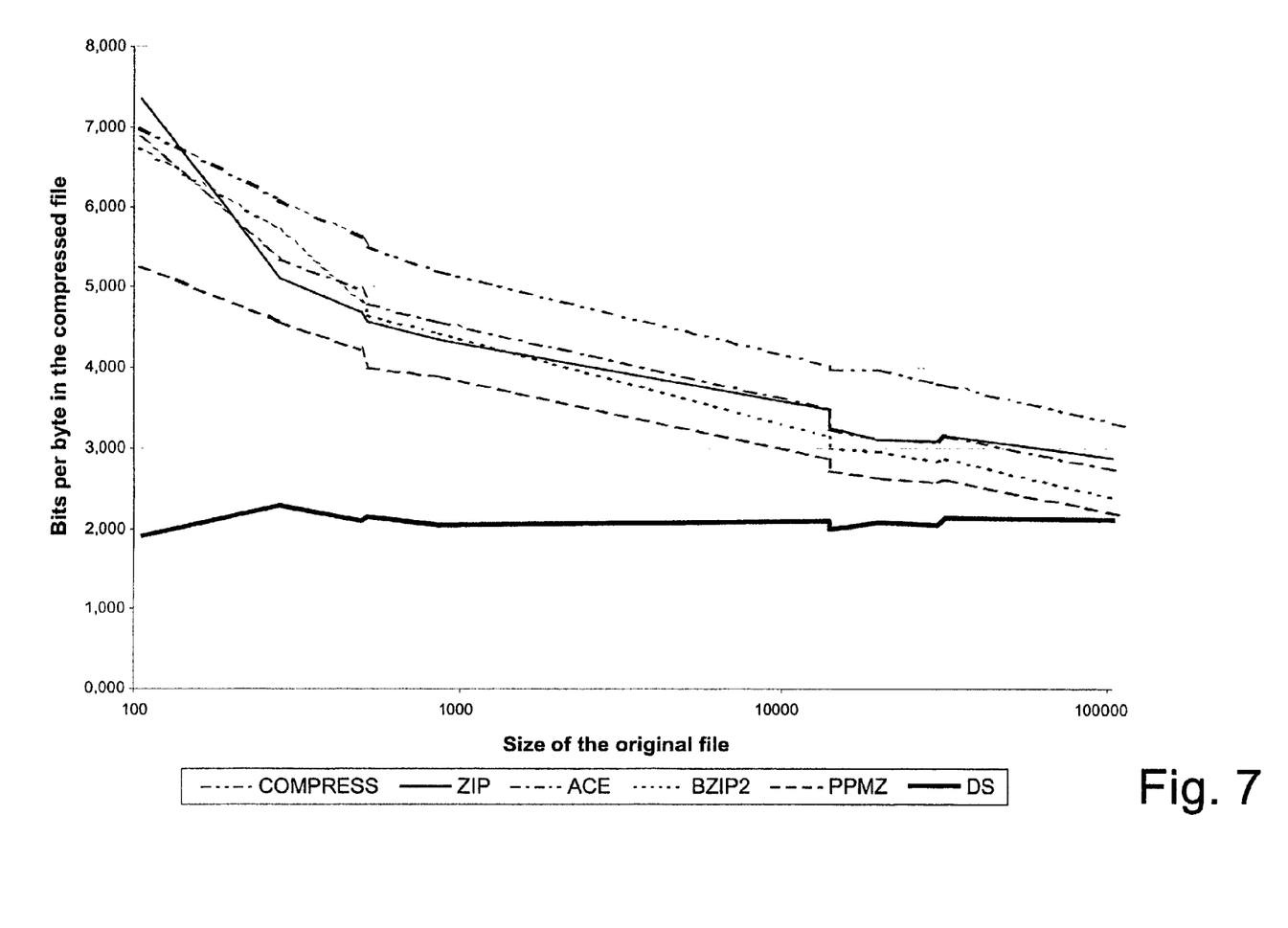

The described method will be applied to English text as training data to obtain the OTM, with which text files of different size will then be compressed. The results of the compression algorithm, called DS, was compared with some of the best known data compression techniques in FIG. 7. It can be seen that the compression method according to an advantageous embodiment of the present invention is better for files up to size about 100 kilobytes, and significantly better for shorter files.

It is obvious that the training data need not to be English text but any text data can be used as the training data. Although in the above description of the invention the training data has been handled from left to right, i.e. from the beginning to the end, it is also possible to handle the training data other way round, i.e. from right to left.

The present invention is not limited solely to the above described embodiments, but it can be modified within the scope of the appended claims.

REFERENCES

[1] Balkenhol, B. and Kurtz, S., "Universal Data Compression Based on the Burrows-Wheeler Transformation", IEEE Trans. on Computers, Vol. 49, No. 10, October 2000.

[2] McCreight, "A Space-Economical Suffix Tree Construction Algorithm", J.ACM, Vol. 23, No. 2, pp 262–272, 1976.

[3] Nohre, R., "Some Topics in Descriptive Complexity", PhD Thesis, Linköping University, Linköping, Sweden, 1994.

[4] Rissanen, J.: "A Universal Data Compression System", *IEEE Transactions on Information Theory*, Vol. IT-29, No. 5, pp 656–664, 1983.

[5] Rissanen, J., "Lectures on Statistical Modeling Theory", Tampere University of Technology, 1999.

[6] Sadakane, K., "A Fast Algorithm for Making Suffix Arrays and for Burrows-Wheeler Transformation", 1998.

[7] Weinberger, M. J., Rissanen, J. & Feder, M., "A Universal Finite Memory Source", *IEEE Trans. on Information Theory*, Vol. IT-41, No. 3, pp 643–652, May 1995.

[8] Elloumi, M., "Algorithms for the Shortest Exact Common Superstring Problem", Computer Science Department, Faculty of Sciences of Tunis, 2000.

What is claimed is:

1. A a device comprising a computer comprising means for carrying out a method for forming a maximal tree for compressing information comprising symbols, the method comprising:

searching statistical data of different symbols from training data;

forming a table comprising rows including strings having a first end and a second end, wherein a special symbol of the training data is at the first end of each string, a remaining portion of each string comprises a minimal number of preceding symbols in the training data to make a context for each special symbol;

assigning probabilities to the symbols that have not yet occurred at context s by using the following equation:

$$\hat{P}_{i|s} = \begin{cases} \frac{m+1/2}{(n_s+1)(d-m)} & \text{if } 0 < m < d/2 \text{ and } n_s > 1 \\ \frac{d-m}{n_s(d-m)} = \frac{1}{n_s} & \text{if } d/2 \le m < d \\ 0 & \text{if } m = d \\ 1/d & \text{if } n_s = 1 \end{cases},$$

in which d is the number of symbols in the alphabet, and m is the number of distinct symbols among the $n_s$ occurrences of symbols at context s; and sorting the contexts in lexical order with priority on the first end.

2. A device comprising a computer comprising means for carrying out a method for forming a maximal tree for compressing information comprising symbols, the method comprising:

searching statistical data of different symbols from training data;

forming a table comprising rows including strings having a first end and a second end, wherein a special symbol of the training data is at the first end of each string, a remaining portion of each string comprises a minimal number of preceding symbols in the training data to make a context for each special symbol;

assigning probabilities to the symbols that have already occurred at context s by using the following equation:

$$\hat{P}_{i|s} = \begin{cases} \left(1 - \frac{m+1/2}{n_s+1}\right)\frac{n_{i|s}}{n_s} & \text{if } 0 < m < d/2 \text{ and } n_s > 1 \\ \frac{n_s-1}{n_s}\frac{n_{i|s}}{n_s} & \text{if } d/2 \le m < d \\ \frac{n_{i|s}}{n_s} & \text{if } m = d \\ 1/d & \text{if } n_s = 1 \end{cases},$$

in which d is the number of symbols in the alphabet, and m is the number of distinct symbols among the $n_s$ occurrences of symbols at contexts; and sorting the contexts in lexical order with priority on the first end.

3. The methed device according to claim 1, wherein the maximal tree and a subtree are represented as tables, said subtree being selected so that it permits encoding the training data within a preset excess percentage p of the minimum code length achievable by any subtree, and wherein the subtree is formed by using the following steps:

Initialization step, in which leaves L(s)=log d, where d is the size of the alphabet, and L(s)=I(s)=0 for all other nodes, Calculation step, in which two code lengths are calculated recursively, from the leaves upwards, from the positive counts of the symbol occurrences $n_{i|sj}$ at the son node sj of the father node s, the first code length being $$I(sj) = -\sum_i n_{i|sj}\log \hat{P}_{i|s},$$

where the symbol probability estimates $\hat{P}_{i|s}$ are calculated by using the Equation $$\hat{P}_{i|s} = \begin{cases} \left(1 - \frac{m+1/2}{n_s+1}\right)\frac{n_{i|s}}{n_s} & \text{if } 0 < m < d/2 \text{ and } n_s > 1 \\ \frac{n_s-1}{n_s}\frac{n_{i|s}}{n_s} & \text{if } d/2 \le m < d \\ \frac{n_{i|s}}{n_s} & \text{if } m = d \\ 1/d & \text{if } n_s = 1 \end{cases},$$

and the second code length being L(s), representing the optimal code length for the same symbols, defined by L(s)=L(s)+L(sj), if I(sj)>max{(1+p)L(sj), L'(sj)} or I(sj)>L(sj)+t; else defined by L(s)=L(s)+I(sj)

Repeating the above steps until the root is reached.

4. The device according to claim 2, wherein the final optimal subtree is stored by storing its generating data string that visits all the contexts of an optimal tree machine, the storing consisting of the following steps:

forming the set of contexts S by using the following rules: the context of every leaf node of the tree is included; for each node s that has exactly one pruned child js the context js is included; for every node s that has more than one pruned children, context λs is included;

generating the shortest exact common superstring $x^k$ for the set of strings S; and converting $x^k$ to the generating string $y^k$ by Burrows-Wheeler transform.

5. A device, comprising:

a computer comprising means for forming a maximal tree for compressing information comprising symbols, in which said maximal tree is generated by searching statistical data of different symbols from a training data, means for forming a table, in which each row consists of a string having a first end and a second end, and a symbol of the training data in said first end, the rest of the string consisting of a minimal number of preceding symbols in the training data to make the so-defined context unique for said symbol, means for assigning probabilities that have not yet occurred at context s by using the following equation:

$$\hat{P}_{i|s} = \begin{cases} \dfrac{m+1/2}{(n_s+1)(d-m)} & \text{if } 0 < m < d/2 \text{ and } n_s > 1 \\ \dfrac{d-m}{n_s(d-m)} = \dfrac{1}{n_s} & \text{if } d/2 \leq m < d \\ 0 & \text{if } m = d \\ 1/d & \text{if } n_s = 1, \end{cases}$$

in which d is the number of symbols in the alphabet, and m is the number of distinct symbols among the $n_s$ occurrences of symbols at context s, and means for sorting the contexts in lexical order with priority on the first end, and means for assigning probabilities to the symbols that have already occurred at context s by using the following equation:

$$\hat{P}_{i|s} = \begin{cases} \left(1 - \dfrac{m+1/2}{n_s+1}\right)\dfrac{n_{i|s}}{n_s} & \text{if } 0 < m < d/2 \text{ and } n_s > 1 \\ \dfrac{n_s-1}{n_s}\dfrac{n_{i|s}}{n_s} & \text{if } d/2 \leq m < d \\ \dfrac{n_{i|s}}{n_s} & \text{if } m = d \\ 1/d & \text{if } n_s = 1, \end{cases}$$

in which d is the number of symbols in the alphabet, and m is the number of distinct symbols among the $n_s$ occurrences of symbols at context s, and means for sorting the contexts in lexical order with priority on the first end.

* * * * *